United States Patent
Yoon et al.

(10) Patent No.: US 8,247,894 B2
(45) Date of Patent: Aug. 21, 2012

(54) INTEGRATED CIRCUIT PACKAGE SYSTEM WITH STEP MOLD RECESS

(75) Inventors: In Sang Yoon, Ichon-si (KR); HanGil Shin, Ichon-si (KR); Jae Han Chung, Ichon-si (KR); DeokKyung Yang, Hanam-si (KR)

(73) Assignee: STATS ChipPAC Ltd., Singapore (SG)

( * ) Notice: Subject to any disclaimer, the term of this patent is extended or adjusted under 35 U.S.C. 154(b) by 680 days.

(21) Appl. No.: 12/053,751

(22) Filed: Mar. 24, 2008

(65) Prior Publication Data

US 2009/0236720 A1    Sep. 24, 2009

(51) Int. Cl.
*H01L 23/02* (2006.01)
(52) U.S. Cl. .......................... 257/686; 257/678; 438/109
(58) Field of Classification Search .................. 361/790; 257/E21.614, E25.006, E25.013, 678, 686; 438/106, 109
See application file for complete search history.

(56) References Cited

U.S. PATENT DOCUMENTS

| | | | |
|---|---|---|---|
| 5,963,430 A * | 10/1999 | Londa | 361/790 |
| 6,876,074 B2 | 4/2005 | Kim | |
| 6,933,176 B1 | 8/2005 | Kirloskar et al. | |
| 7,061,088 B2 | 6/2006 | Karnezos | |
| 7,190,061 B2 | 3/2007 | Lee | |
| 7,279,786 B2 | 10/2007 | Kim | |
| 7,288,835 B2 | 10/2007 | Yim et al. | |
| 7,288,841 B2 | 10/2007 | Yamano | |
| 7,317,247 B2 | 1/2008 | Lee et al. | |
| 7,354,800 B2 * | 4/2008 | Carson | 438/109 |
| 2003/0124766 A1 * | 7/2003 | Kim et al. | 438/106 |
| 2004/0145039 A1 * | 7/2004 | Shim et al. | 257/678 |
| 2006/0073635 A1 | 4/2006 | Su et al. | |
| 2006/0175695 A1 | 8/2006 | Lee | |
| 2006/0180911 A1 | 8/2006 | Jeong et al. | |
| 2006/0220209 A1 | 10/2006 | Karnezos et al. | |
| 2006/0220210 A1 | 10/2006 | Karnezos et al. | |
| 2006/0267175 A1 | 11/2006 | Lee | |
| 2006/0284299 A1 | 12/2006 | Karnezos | |
| 2007/0148822 A1 | 6/2007 | Haba et al. | |
| 2007/0190690 A1 | 8/2007 | Chow et al. | |
| 2007/0216006 A1 | 9/2007 | Park et al. | |
| 2007/0246815 A1 * | 10/2007 | Lu et al. | 257/686 |
| 2007/0278696 A1 | 12/2007 | Lu et al. | |
| 2007/0290319 A1 * | 12/2007 | Kim | 257/686 |
| 2009/0166834 A1 | 7/2009 | Yoon et al. | |

\* cited by examiner

*Primary Examiner* — Matthew E Warren
*Assistant Examiner* — Fang-Xing Jiang
(74) *Attorney, Agent, or Firm* — Ishimaru & Associates LLP; Mikio Ishimaru; Stanley Chang

(57) ABSTRACT

An integrated circuit package system includes: providing a stackable integrated circuit package system having a base encapsulation and a recess therein; stacking a top integrated circuit package system, having a top encapsulation with a protruding portion, with the stackable integrated circuit package system with the protruding portion aligned and matched within the recess; and connecting the top integrated circuit package system and the stackable integrated circuit package system.

20 Claims, 7 Drawing Sheets

INTEGRATED CIRCUIT PACKAGE SYSTEM WITH STEP MOLD RECESS

TECHNICAL FIELD

The present invention relates generally to an integrated circuit package system and more particularly to an integrated circuit package system having an encapsulation.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate.

Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry.

Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals of the computer industry.

However, PIP and POP products encounter various problems. The process of stacking integrated circuit packages can suffer from yield and reliability issues due to misalignment of connecting electrical contacts. As the pitch of the electrical interconnect such as solder balls or solder bumps, decreases, misalignment of electrical connections becomes an increasing problem affecting the yield, reliability, and cost of the end product.

Thus, a need still remains for an integrated circuit package system providing low cost manufacturing, improved yield, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a stackable integrated circuit package system having a base encapsulation and a recess therein; stacking a top integrated circuit package system, having a top encapsulation with a protruding portion, with the stackable integrated circuit package system with the protruding portion aligned and matched within the recess; and connecting the top integrated circuit package system and the stackable integrated circuit package system.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
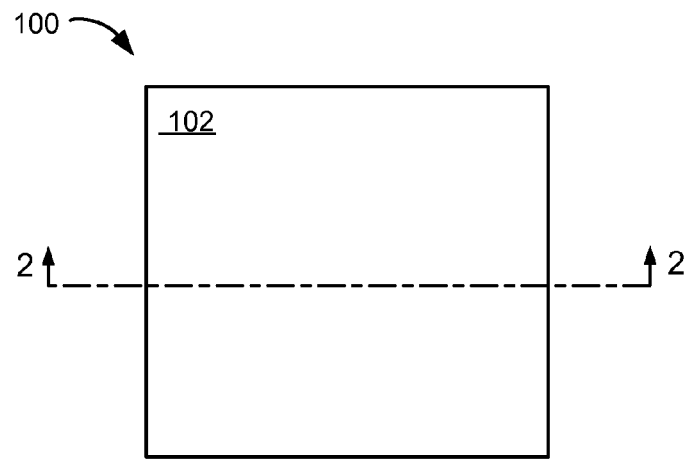
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts a top encapsulation 102, such as an encapsulation formed from an epoxy molding compound. For illustrative purposes, the integrated circuit package system 100 is shown with a square geometric shape, although it is understood that the shape of the integrated circuit package system 100 may be different, such as rectangular or a geometric shape that is not a square.

Figure 2:
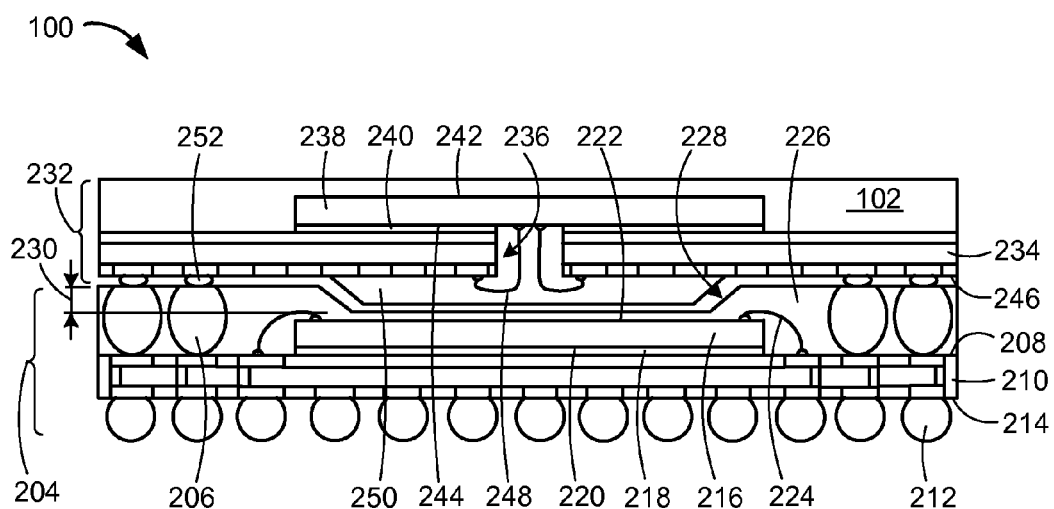
FIG. 2 is a cross-sectional view of the integrated circuit package system along line 2-2 of FIG. 1.

Referring now to FIG. 2, therein is shown a cross-sectional view of the integrated circuit package system 100 along 2-2 of FIG. 1. The integrated circuit package system 100 includes a stackable integrated circuit package system 204 having stackable interconnects 206 such as solder-on-pad connections or embedded solder balls. The stackable interconnects 206 are attached on a first base side 208 of a base carrier 210, such as a laminated substrate.

Bottom interconnects 212, such as solder balls, can connect to a second base side 214 of the base carrier 210, wherein the second base side 214 is on the opposing side of the first base side 208. A first integrated circuit 216, such as an integrated circuit die, is attached to the first base side 208 with a first adhesive 218, such as a die-attach adhesive. The first integrated circuit 216 includes a first non-active side 220 and a first active side 222 with active circuitry fabricated thereon. The first non-active side 220 faces the base carrier 210. The first integrated circuit 216 is electrically connected to the base carrier 210 by first electrical connectors 224, such as bond wires.

A base encapsulation 226, such as an epoxy molding compound, includes a recess 228 and is over the first base side 208 covering the first integrated circuit 216 and the first electrical connectors 224. The base encapsulation 226 partially covers the stackable interconnects 206 and exposes a portion of the stackable interconnects 206 not facing the base carrier 210.

The recess 228 of the base encapsulation 226 can be formed in any number of configurations. For example, the recess 228 is formed in a step mold profile having a recess height 230 preferably to accommodate stacking structure.

The stackable interconnects 206 can be formed over the base carrier 210 adjacent to the first integrated circuit 216. The stackable interconnects 206 can extend above the first integrated circuit 216 and the first electrical connectors 224. The stackable interconnects 206 can be of any shapes such as sphere, pillar, or stud.

A top integrated circuit package system 232 includes a top carrier 234, such as a laminated substrate, having a hole 236. A second integrated circuit 238, such as an integrated circuit die, mounts over the top carrier 234 with a second adhesive 240, such as a die-attach adhesive, and over the hole 236. The second integrated circuit 238 includes a second non-active side 242 and a second active side 244 with active circuitry fabricated thereon. The second active side 244 faces the top carrier 234 and connects to a bottom side 246 of the top carrier 234 with second electrical connectors 248, such as bond wires, through the hole 236.

The top encapsulation 102 is over the top carrier 234 covering the second integrated circuit 238. The top encapsulation 102 includes a protruding portion 250 that fills the hole 236, covers the second electrical connectors 248, and covers a portion of the bottom side 246 of the top carrier 234 adjacent to the hole 236. Stacking connectors 252, such as solder bumps, can be attached to the bottom side 246 of the top carrier 234.

The top integrated circuit package system 232 mounts over the stackable integrated circuit package system 204 with stacking alignment aided by the protruding portion 250 of the top encapsulation 102 and the recess 228 of the base encapsulation 226. The protruding portion 250 of the top integrated circuit package system 232 fits and matches into the recess 228 of the stackable integrated circuit package system 204. The protruding portion 250 and the recess 228 aid in aligning the stacking connectors 252 with the exposed portion of the stackable interconnects 206 for forming the integrated circuit package system 100. The stacking connectors 252 connect between the stackable intergrated circuit package system 204 and the top intergrated circuit package system 232. The protruding portion 250 extends below the stacking connectors 252.

Figure 3:
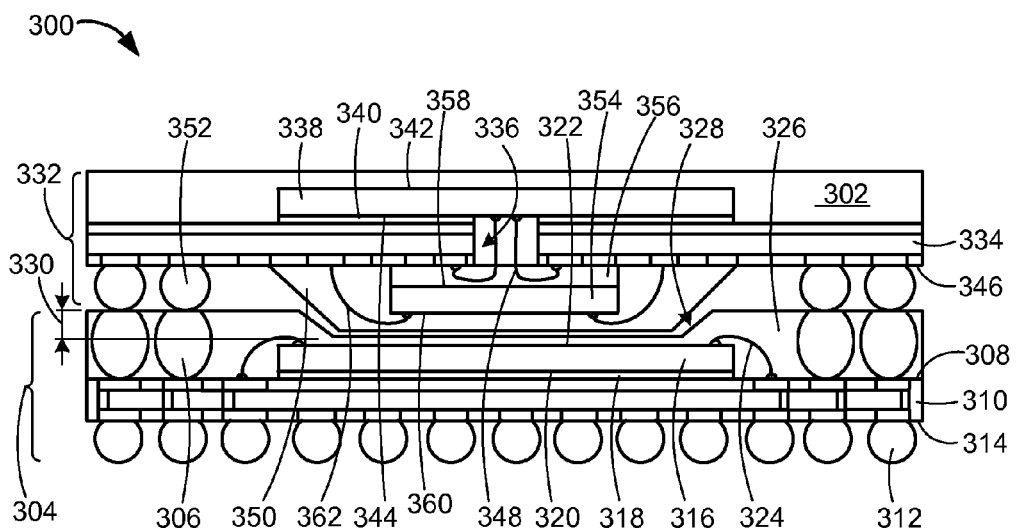
FIG. 3 is a cross-sectional view of the integrated circuit package system as exemplified by the top view of FIG. 1 in a second embodiment of the present invention.

Referring now to FIG. 3, therein is shown a cross-sectional view of an integrated circuit package system 300 as exemplified by the top view of FIG. 1 in a second embodiment of the present invention. The integrated circuit package system 300 includes a stackable integrated circuit package system 304 having stackable interconnects 306, such as solder-on-pad connections or embedded solder balls. The stackable interconnects 306 are attached on a first base side 308 of a base carrier 310, such as a laminated substrate.

Bottom interconnects 312, such as solder balls, can connect to a second base side 314 of the base carrier 310, wherein the second base side 314 is on the opposing side of the first base side 308. A first integrated circuit 316, such as an integrated circuit die, is attached to the first base side 308 with a first adhesive 318, such as a die-attach adhesive. The first integrated circuit 316 includes a first non-active side 320 and a first active side 322 with active circuitry fabricated thereon. The first non-active side 320 faces the base carrier 310. The first integrated circuit 316 is electrically connected to the base carrier 310 by first electrical connectors 324, such as bond wires.

A base encapsulation 326, such as an epoxy molding compound, includes a recess 328 and is over the first base side 308 covering the first integrated circuit 316 and the first electrical connectors 324. The base encapsulation 326 partially covers the stackable interconnects 306 and exposes a portion of the stackable interconnects 306 not facing the base carrier 310.

The recess 328 of the base encapsulation 326 can be formed in any number of configurations. For example, the recess 328 is formed in a step mold profile having a recess height 330 preferably to accommodate stacking structure.

The stackable interconnects 306 can be formed over the base carrier 310 adjacent to the first integrated circuit 316. The stackable interconnects 306 can extend above the first integrated circuit 316 and the first electrical connectors 324. The stackable interconnects 306 can be of any shapes such as sphere, pillar, or stud.

A top integrated circuit package system 332 includes a top carrier 334, such as a laminated substrate, having a hole 336. A second integrated circuit 338, such as an integrated circuit die, mounts over the top carrier 334 with a second adhesive 340, such as a die-attach adhesive, and over the hole 336. The second integrated circuit 338 includes a second non-active side 342 and a second active side 344 with active circuitry fabricated thereon. The second active side 344 faces the top carrier 334 and connects to a bottom side 346 of the top carrier 334 with second electrical connectors 348 through the hole 336.

A third integrated circuit 354, such as an integrated circuit die, can attach under the top carrier 334 with a third adhesive 356, such as a wire-in film adhesive, and under the hole 336. The third integrated circuit 354 includes a third non-active side 358 and a third active side 360 with active circuitry fabricated thereon. The third active side 360 faces away from the top carrier 334 and connects to the bottom side 346 of the top carrier 334 with third electrical connectors 362.

A top encapsulation 302, such as a cover including epoxy molding compound, is over the top carrier 334 covering the second integrated circuit 338. The top encapsulation 302 includes a protruding portion 350 that covers the third integrated circuit 354, the third electrical connectors 362 and covers a portion of the bottom side 346 of the top carrier 334 adjacent to the hole 336. The top encapsulation 302 also fills the hole 336. Stacking connectors 352, such as solder bumps, can be attached to the exposed portion of the bottom side 346 of the top carrier 334.

The top integrated circuit package system 332 mounts over the stackable integrated circuit package system 304 with stacking alignment aided by the protruding portion 350 of the top encapsulation 302 and the recess 328 of the base encapsulation 326. The protruding portion 350 of the top integrated circuit package system 332 fits and matches into the recess 328 of the stackable integrated circuit package system 304. The protruding portion 350 and the recess 328 aid in aligning the stacking connectors 352 with the exposed portion of the stackable interconnects 306 for forming the integrated circuit package system 300.

Figure 4:
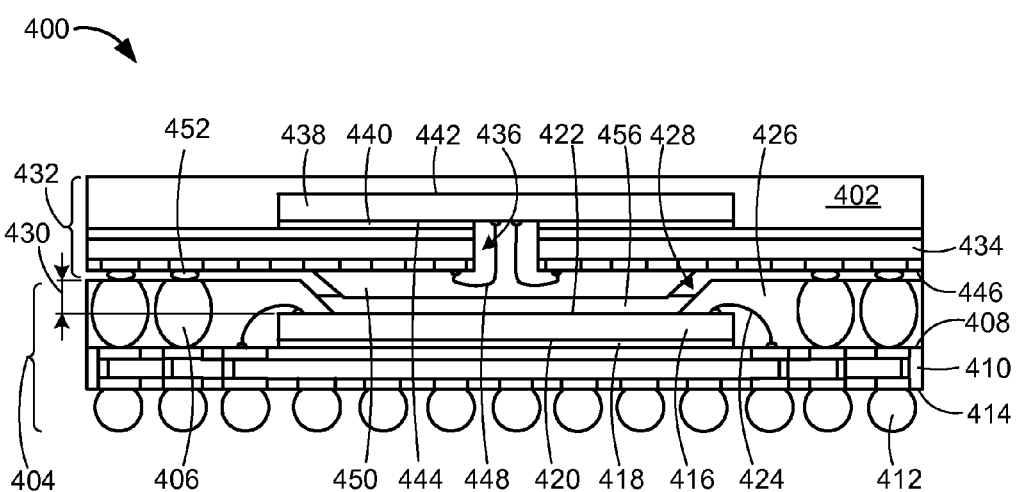
FIG. 4 is a is a cross-sectional view of an integrated circuit package system as exemplified by the top view of FIG. 1 in a third embodiment of the present invention.

Referring now to FIG. 4, therein is shown a cross-sectional view of an integrated circuit package system 400 as exemplified by the top view of FIG. 1 in a third embodiment of the present invention. The integrated circuit package system 400 includes a stackable integrated circuit package system 404 having stackable interconnects 406, such as solder-on-pad connections or embedded solder balls. The stackable interconnects 406 are attached on a first base side 408 of a base carrier 410, such as a laminated substrate.

Bottom interconnects 412, such as solder balls, can connect to a second base side 414 of the base carrier 410, wherein the second base side 414 is on the opposing side of the first base side 408. A first integrated circuit 416, such as an integrated circuit die, is attached to the first base side 408 with a first adhesive 418, such as a die-attach adhesive. The first integrated circuit 416 includes a first non-active side 420 and a first active side 422 with active circuitry fabricated thereon. The first non-active side 420 faces the base carrier 410. The first integrated circuit 416 is electrically connected to the base carrier 410 by first electrical connectors 424, such as bond wires.

A base encapsulation 426, such as an epoxy molding compound, includes a recess 428 and is over the first base side 408 covering the first electrical connectors 424 and partially covering the first integrated circuit 416. The base encapsulation 426 can expose a portion of the first active side 422 of the first integrated circuit 416 within the recess 428 of the base encapsulation 426. The base encapsulation 426 partially covers the stackable interconnects 406 and exposes a portion of the stackable interconnects 406 not facing the base carrier 410.

The recess 428 of the base encapsulation 426 can be formed in any number of configurations. For example, the recess 428 is formed in a step mold profile having a recess height 430 preferably to accommodate stacking structure.

The stackable interconnects 406 can be formed over the base carrier 410 adjacent to the first integrated circuit 416. The stackable interconnects 406 can extend above the first integrated circuit 416 and the first electrical connectors 424. The stackable interconnects 406 can be of any shapes such as sphere, pillar, or stud.

A top integrated circuit package system 432 includes a top carrier 434, such as a laminated substrate, having a hole 436. A second integrated circuit 438, such as an integrated circuit die, mounts over the top carrier 434 with a second adhesive 440, such as a die-attach adhesive, and over the hole 436. The second integrated circuit 438 includes a second non-active side 442 and a second active side 444 with active circuitry fabricated thereon. The second active side 444 faces the top carrier 434 and connects to a bottom side 446 of the top carrier 434 with second electrical connectors 448 through the hole 436.

A top encapsulation 402 is over the top carrier 434 covering the second integrated circuit 438. The top encapsulation 402 includes a protruding portion 450 that fills the hole 436, covers the second electrical connectors 448, and covers a portion of the bottom side 446 of the top carrier 434 adjacent to the hole 436. Stacking connectors 452, such as solder bumps, can be attached to exposed portion of the bottom side 446 of the top carrier 434.

The top integrated circuit package system 432 mounts over the stackable integrated circuit package system 404 with stacking alignment aided by the protruding portion 450 of the top encapsulation 402 and the recess 428 of the base encapsulation 426. The protruding portion 450 can attach with the first integrated circuit 416 with a third adhesive 456, such as a die-attach adhesive, in the recess 428 of the stackable integrated circuit package system 404. The protruding portion 450 and the recess 428 aid in aligning the stacking connectors 452 with the exposed portion of the stackable interconnects 406 for forming the integrated circuit package system 400.

Figure 5:
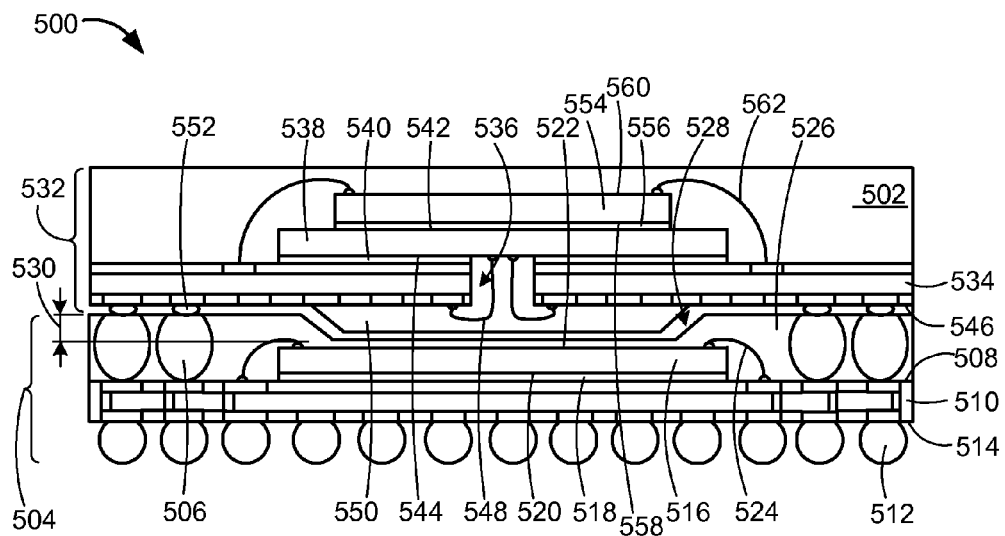
FIG. 5 is a cross-sectional view of an integrated circuit package system as exemplified by the top view of FIG. 1 in a fourth embodiment of the present invention.

Referring now to FIG. 5, therein is shown a cross-sectional view of an integrated circuit package system 500 as exemplified by the top view of FIG. 1 in a fourth embodiment of the present invention. The integrated circuit package system 500 includes a stackable integrated circuit package system 504 having stackable interconnects 506 such as solder-on-pad connections or embedded solder balls. The stackable interconnects 506 are attached on a first base side 508 of a base carrier 510, such as a laminated substrate.

Bottom interconnects 512, such as solder balls, can connect to a second base side 514 of the base carrier 510, wherein the second base side 514 is on the opposing side of the first base side 508. A first integrated circuit 516, such as an integrated circuit die, is attached to the first base side 508 with a first adhesive 518, such as a die-attach adhesive. The first integrated circuit 516 includes a first non-active side 520 and a first active side 522 with active circuitry fabricated thereon. The first non-active side 520 faces the base carrier 510. The first integrated circuit 516 is electrically connected to the base carrier 510 by first electrical connectors 524, such as bond wires.

A base encapsulation 526, such as an epoxy molding compound, includes a recess 528 and is over on the first base side 508 covering the first integrated circuit 516 and the first electrical connectors 524. The base encapsulation 526 partially covers the stackable interconnects 506 and exposes a portion of the stackable interconnects 506 not facing the base carrier 510.

The recess 528 of the base encapsulation 526 can be formed in any number of configurations. For example, the recess 528 is formed in a step mold profile having a recess height 530 preferably to accommodate stacking structure.

The stackable interconnects 506 can be formed over the base carrier 510 adjacent to the first integrated circuit 516. The stackable interconnects 506 can extend above the first integrated circuit 516 and the first electrical connectors 524. The stackable interconnects 506 can be of any shapes such as sphere, pillar, or stud.

A top integrated circuit package system 532 includes a top carrier 534, such as a laminated substrate, having a hole 536. A second integrated circuit 538, such as an integrated circuit die, mounts over the top carrier 534 with a second adhesive 540, such as a die-attach adhesive, and over the hole 536. The second integrated circuit 538 includes a second non-active side 542 and a second active side 544 with active circuitry fabricated thereon. The second active side 544 faces the top carrier 534 and connects to a bottom side 546 of the top carrier 534 with second electrical connectors 548 through the hole 536.

A third integrated circuit 554, such as an integrated circuit die, stacks over the second integrated circuit 538 with a third adhesive 556, such as a die-attach adhesive. The third integrated circuit 554 includes a third non-active side 558 and a third active side 560 with active circuitry fabricated thereon. The third non-active side 558 faces the second integrated circuit 538. A third electrical connectors 562, such as bond wires, connect the third active side 560 of the third integrated circuit 554 and the top carrier 534.

A top encapsulation 502 is over the top carrier 534 covering the second integrated circuit 538, the third integrated circuit 554, and the third electrical connectors 562. The top encapsulation 502 includes a protruding portion 550 that fills the hole 536, covers the second electrical connectors 548, and portion of the bottom side 546 of the top carrier 534 adjacent to the hole 536. Stacking connectors, such as solder bumps, can be attached to the bottom side 546 of the top carrier 534.

The top integrated circuit package system 532 mounts over the stackable integrated circuit package system 504 with stacking alignment aided by the protruding portion 550 of the top encapsulation 502 and the recess 528 of the base encapsulation 526. The protruding portion 550 of the top integrated circuit package system 532 fits and matches into the recess 528 of the stackable integrated circuit package system 504. The protruding portion 550 and the recess 528 aid in aligning stacking connectors 552 with the exposed portion of the stackable interconnects 506 for forming the integrated circuit package system 500.

It is understood that the number, sizes, and shapes of integrated circuit dice stacked over the top carrier 534 is provided for illustrative purposes, the configuration of the integrated circuit dice can vary. It is also understood that the number and placement of the stacking connectors 552 and the stackable interconnects 506 are provided for illustrative purposes, the number and placement for each can vary.

Figure 6:
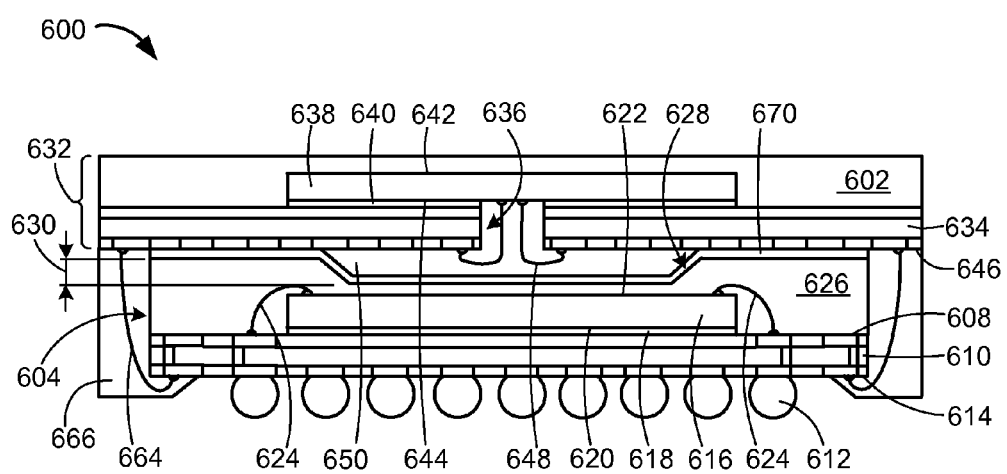
FIG. 6 is a is a cross-sectional view of an integrated circuit package system as exemplified by the top view of FIG. 1 in a fifth embodiment of the present invention.

Referring now to FIG. 6, therein is shown a cross-sectional view of an integrated circuit package system 600 as exemplified by the top view of FIG. 1 in a sixth embodiment of the present invention. The integrated circuit package system 600 includes a stackable integrated circuit package system 604 having a base encapsulation 626, such as an epoxy molding compound, formed over a first base side 608 of a base carrier 610, such as a laminated substrate.

Bottom interconnects 612, such as solder balls, can connect to a second base side 614 of the base carrier 610, wherein the second base side 614 is on the opposing side of the first base side 608. A first integrated circuit 616, such as an integrated circuit die, is attached to the first base side 608 with a first adhesive 618, such as a die-attach adhesive. The first integrated circuit 616 includes a first non-active side 620 and a first active side 622 with active circuitry fabricated thereon. The first non-active side 620 faces the base carrier 610. The first integrated circuit 616 is electrically connected to the base carrier 610 by first electrical connectors 624, such as bond wires.

The base encapsulation 626 includes a recess 628 and is over the first base side 608 covering the first integrated circuit 616 and the first electrical connectors 624. The recess 628 of the base encapsulation 626 can be formed in any number of configurations. For example, the recess 628 is formed in a step mold profile having a recess height 630 preferably to accommodate stacking structure.

A top integrated circuit package system 632 includes a top carrier 634, such as a laminated substrate, having a hole 636. A second integrated circuit 638, such as an integrated circuit die, mounts over the top carrier 634 with a second adhesive 640, such as a die-attach adhesive, and over the hole 636. The second integrated circuit 638 includes a second non-active side 642 and a second active side 644 with active circuitry fabricated thereon. The second active side 644 faces the top carrier 634 and connects to a bottom side 646 of the top carrier 634 with second electrical connectors 648 through the hole 636.

A top encapsulation 602 is over the top carrier 634 covering the second integrated circuit 638. The top encapsulation 602 includes a protruding portion 650 that fills the hole 636, covers the second electrical connectors 648, and covers a portion of the bottom side 646 of the top carrier 634 adjacent to the hole 636.

The top integrated circuit package system 632 mounts over the stackable integrated circuit package system 604 with a stacking adhesive 670 between the top carrier 634 and the base encapsulation 626. The protruding portion 650 of the top encapsulation 602 and the recess 628 of the base encapsulation 626 can aid stacking alignment between the top integrated circuit package system 632 and the stackable integrated circuit package system 604. The protruding portion 650 of the top integrated circuit package system 632 fits and matches into the recess 628 of the stackable integrated circuit package system 604. The top integrated circuit package system 632 can overhang over the stackable integrated circuit package system 604.

Fourth electrical connectors 664, such as bond wires, connects a overhanging portion of the top carrier 634 and the second base side 614 the base carrier 610 of the stackable integrated circuit package system 604. A package encapsulation 666, such as a cover including an epoxy molding compound, covers the fourth electrical connectors 664, non-horizontal peripheral sides of the stackable integrated circuit package system 604, and a peripheral portion of the second base side 614 of the base carrier 610.

Figure 7:
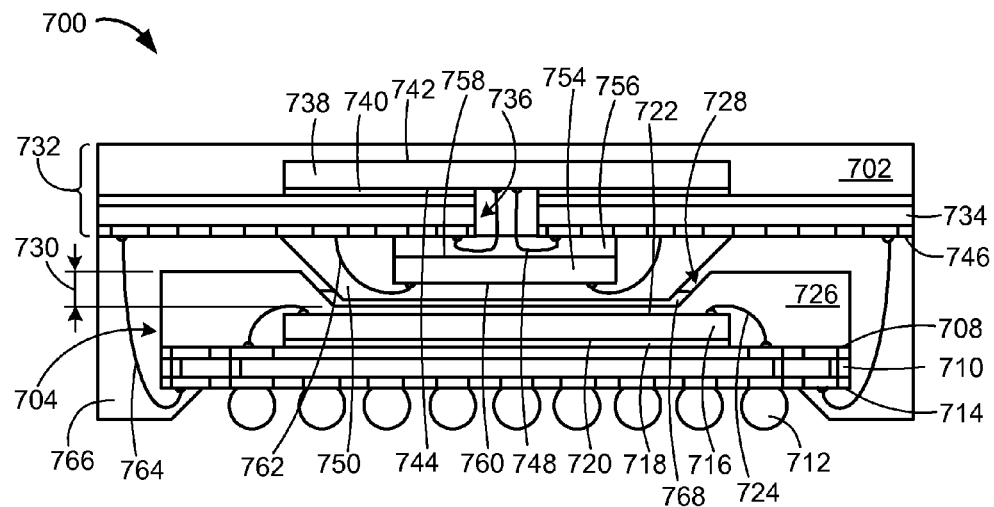
FIG. 7 is a is a cross-sectional view of an integrated circuit package system as exemplified by the top view of FIG. 1 in a sixth embodiment of the present invention.

Referring now to FIG. 7, therein is shown a cross-sectional view of an integrated circuit package system 700 as exemplified by the top view of FIG. 1 in a sixth embodiment of the present invention. The integrated circuit package system 700 includes a stackable integrated circuit package system 704 having a base encapsulation 726, such as an epoxy molding compound, formed over a first base side 708 of a base carrier 710, such as a laminated substrate.

Bottom interconnects 712, such as solder balls, can connect to a second base side 714 of the base carrier 710, wherein the second base side 714 is on the opposing side of the first base side 708. A first integrated circuit 716, such as an integrated circuit die, is attached to the first base side 708 with a first adhesive 718, such as a die-attach adhesive. The first integrated circuit 716 includes a first non-active side 720 and a first active side 722 with active circuitry fabricated thereon. The first non-active side 720 faces the base carrier 710. The first integrated circuit 716 is electrically connected to the base carrier 710 by first electrical connectors 724, such as bond wires.

The base encapsulation 726 includes a recess 728 and is over the first base side 708 covering the first integrated circuit 716 and the first electrical connectors 724. The recess 728 of the base encapsulation 726 can be formed in any number of configurations. For example, the recess 728 is formed in a step mold profile having a recess height 730 preferably to accommodate stacking structure.

A top integrated circuit package system 732 includes a top carrier 734, such as a laminated substrate, having a hole 736. A second integrated circuit 738, such as an integrated circuit die, mounts over the top carrier 734 with a second adhesive 740, such as a die-attach adhesive, and over the hole 736. The second integrated circuit 738 includes a second non-active side 742 and a second active side 744 with active circuitry fabricated thereon. The second active side 744 faces the top carrier 734 and connects to a bottom side 746 of the top carrier 734 with second electrical connectors 748 through the hole 736.

A third integrated circuit 754, such as an integrated circuit die, is attached under the top carrier 734 with a third adhesive 756, such as a die-attach adhesive, and under the hole 736. The third adhesive 756 can cover the second electrical connectors 748. The third integrated circuit 754 includes a third non-active side 758 and a third active side 760 with active circuitry fabricated thereon. The third active side 760 faces away from the top carrier 734 and connects to the bottom side 746 of the top carrier 734 with third electrical connectors 762.

A top encapsulation 702 is over the top carrier 734 covering the second integrated circuit 738 and filling the hole 736. The top encapsulation 702 includes a protruding portion 750 that covers the third integrated circuit 754, the third electrical connectors 762, and covers a portion of the bottom side 746 of the top carrier 734 adjacent to the hole 736.

The top integrated circuit package system 732 mounts over the stackable integrated circuit package system 704 with stacking alignment aided by the protruding portion 750 of the top encapsulation 702 and the recess 728 of the base encapsulation 726. The protruding portion 750 of the top integrated circuit package system 732 fits and matches into the recess 728 of the stackable integrated circuit package system 704. The protruding portion 750 of the top integrated circuit package system 732 attaches in the recess 728 of the base encapsulation 726 with a fourth adhesive 768, such as a die-attach adhesive. The top integrated circuit package system 732 can overhang over the stackable integrated circuit package system 704.

Fourth electrical connectors 764, such as bond wires, connects a overhanging portion of the top carrier 734 and the second base side 714 the base carrier 710 of the stackable integrated circuit package system 704. A package encapsulation 766, such as a cover including an epoxy molding compound, covers the fourth electrical connectors 764, non-horizontal peripheral sides of the stackable integrated circuit package system 704, and a peripheral portion of the second base side 714 of the base carrier 710.

Figure 8:
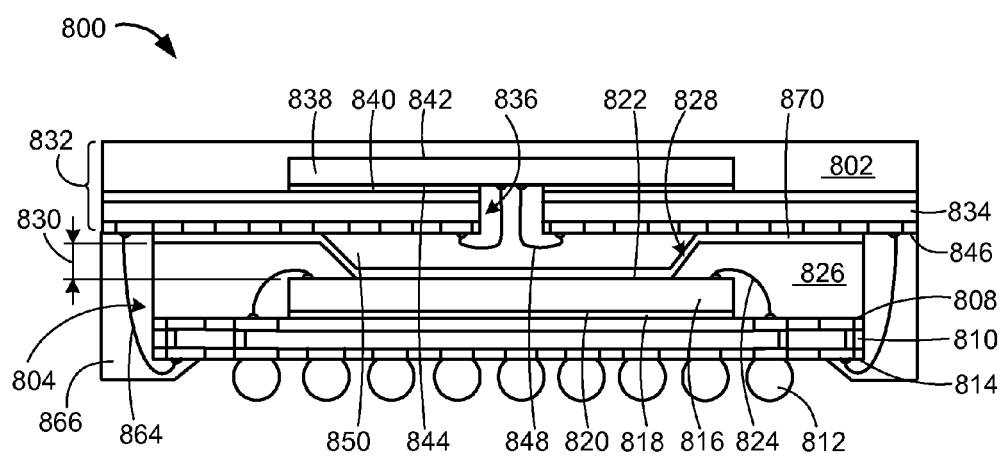
FIG. 8 is a is a cross-sectional view of an integrated circuit package system as exemplified by the top view of FIG. 1 in a seventh embodiment of the present invention.

Referring now to FIG. 8, therein is shown a cross-sectional view of an integrated circuit package system 800 as exemplified by the top view of FIG. 1 in a seventh embodiment of the present invention. The integrated circuit package system 800 includes a stackable integrated circuit package system 804 having a base encapsulation 826, such as an epoxy molding compound, formed over a first base side 808 of a base carrier 810, such as a laminated substrate.

Bottom interconnects 812, such as solder balls, can connect to a second base side 814 of the base carrier 810, wherein the second base side 814 is on the opposing side of the first base side 808. A first integrated circuit 816, such as an integrated circuit die, is attached to the first base side 808 with a first adhesive 818, such as a die-attach adhesive. The first integrated circuit 816 includes a first non-active side 820 and a first active side 822 with active circuitry fabricated thereon. The first non-active side 820 faces the base carrier 810. The first integrated circuit 816 is electrically connected to the base carrier 810 by first electrical connectors 824, such as bond wires.

The base encapsulation 826 includes a recess 828 and is over the first base side 808 covering the first electrical connectors 824. The base encapsulation 826 can partially expose the first active side 822 of the first integrated circuit 816 with the recess 828. The recess 828 of the base encapsulation 826 can be formed in any number of configurations. For example, the recess 828 is formed in a step mold profile having a recess height 830 preferably to accommodate stacking structure.

A top integrated circuit package system 832 includes a top carrier 834, such as a laminated substrate, having a hole 836. A second integrated circuit 838, such as an integrated circuit die, mounts over the top carrier 834 with a second adhesive 840, such as a die-attach adhesive, and over the hole 836. The second integrated circuit 838 includes a second non-active side 842 and a second active side 844 with active circuitry fabricated thereon. The second active side 844 faces the top carrier 834 and connects to a bottom side 846 of the top carrier 834 with second electrical connectors 848 through the hole 836.

A top encapsulation 802 is over the top carrier 834 covering the second integrated circuit 838. The top encapsulation 802 includes a protruding portion 850 that fills the hole 836, covers the second electrical connectors 848, and covers a portion of the bottom side 846 of the top carrier 834 adjacent to the hole 836.

The top integrated circuit package system 832 mounts over the stackable integrated circuit package system 804 with a stacking adhesive 870 between the top carrier 834, the base encapsulation 826, and the first active side 822. The protruding portion 850 of the top encapsulation 802 and the recess 828 of the base encapsulation 826 can aid stacking alignment between the top integrated circuit package system 832 and the stackable integrated circuit package system 804. The protruding portion 850 of the top integrated circuit package system 832 fits and matches into the recess 828 of the stackable integrated circuit package system 804. The top integrated circuit package system 832 can overhang over the stackable integrated circuit package system 804.

Fourth electrical connectors 864, such as bond wires, connects a overhanging portion of the top carrier 834 and the second base side 814 the base carrier 810 of the stackable integrated circuit package system 804. A package encapsulation 866, such as a cover including an epoxy molding compound, covers the fourth electrical connectors 864, non-horizontal peripheral sides of the stackable integrated circuit package system 804, and a peripheral portion of the second base side 814 of the base carrier 810.

For illustrative purposes, the first integrated circuit 816 of the stackable integrated circuit package system 804 is shown with wire bonded integrated circuit die, although it is understood that the first integrated circuit 816 can be different types of integrated circuit. For example, the first integrated circuit 816 can be a ball grid array (BGA) device, a land grid array (LGA) device, a quad flat nonleaded (QFN) device, a quad flat package (QFP) device, a bump chip carrier (BCC) device, a flip chip, a passive component, or a combination thereof.

Figure 9:
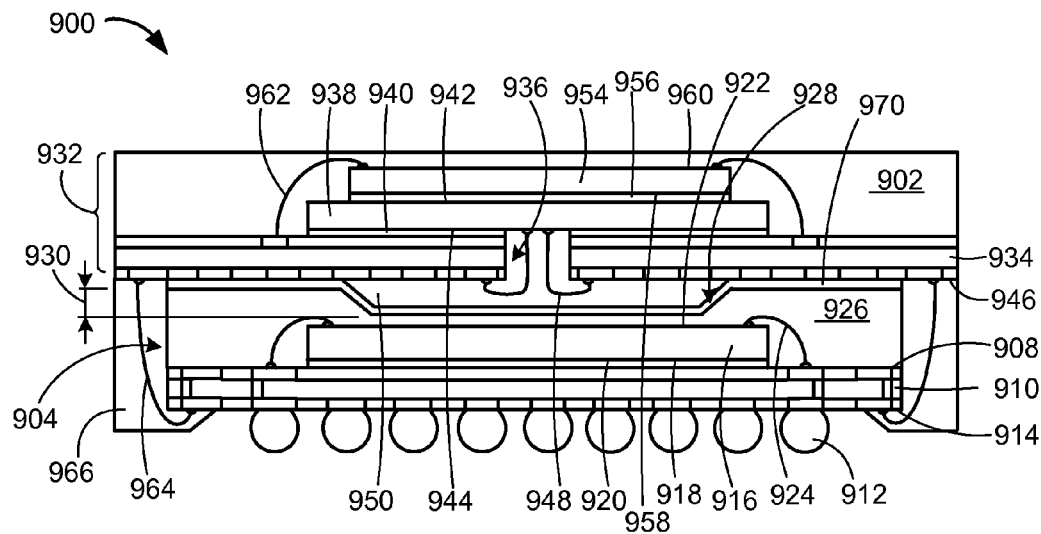
FIG. 9 is a is a cross-sectional view of an integrated circuit package system as exemplified by the top view of FIG. 1 in an eighth embodiment of the present invention.

Referring now to FIG. 9, therein is shown a cross-sectional view of an integrated circuit package system 900 as exemplified by the top view of FIG. 1 in an eighth embodiment of the present invention. The integrated circuit package system 900 includes a stackable integrated circuit package system 904 having a base encapsulation 926, such as an epoxy molding compound, formed over a first base side 908 of a base carrier 910, such as a laminated substrate.

Bottom interconnects 912, such as solder balls, can connect to a second base side 914 of the base carrier 910, wherein the second base side 914 is on the opposing side of the first base side 908. A first integrated circuit 916, such as an integrated circuit die, is attached to the first base side 908 with a first adhesive 918, such as a die-attach adhesive. The first integrated circuit 916 includes a first non-active side 920 and a first active side 922 with active circuitry fabricated thereon. The first non-active side 920 faces the base carrier 910. The first integrated circuit 916 is electrically connected to the base carrier 910 by first electrical connectors 924, such as bond wires.

The base encapsulation 926 includes a recess 928 and is over the first base side 908 covering the first integrated circuit 916 and the first electrical connectors 924. The recess 928 of the base encapsulation 926 can be formed in any number of configurations. For example, the recess 928 is formed in a step mold profile having a recess height 930 preferably to accommodate stacking structure.

A top integrated circuit package system 932 includes a top carrier 934, such as a laminated substrate, having a hole 936. A second integrated circuit 938, such as an integrated circuit die, mounts over the top carrier 934 with a second adhesive 940, such as a die-attach adhesive, and over the hole 936. The second integrated circuit 938 includes a second non-active side 942 and a second active side 944 with active circuitry fabricated thereon. The second active side 944 faces the top carrier 934 and connects to a bottom side 946 of the top carrier 934 with second electrical connectors 948 through the hole 936.

In this example, a third integrated circuit 954, such as an integrated circuit die, is mounted over the second integrated circuit 938 with a third adhesive 956, such as a die-attach adhesive. The third integrated circuit 954 includes a third non-active side 958 and a third active side 960 with active circuitry fabricated thereon. The third integrated circuit 954 is electrically connected to the top carrier 934 by third electrical connectors 962, such as bond wires.

A top encapsulation 902 is over the top carrier 934 covering the second integrated circuit 938, the third integrated circuit 954, and the third electrical connectors 962. The top encapsulation 902 includes a protruding portion 950 that fills the hole 936, covers the second electrical connectors 948, and covers a portion of the bottom side 946 of the top carrier 934 adjacent to the hole 936.

The top integrated circuit package system 932 mounts over the stackable integrated circuit package system 904 with a stacking adhesive 970 between the top carrier 934 and the base encapsulation 926. The protruding portion 950 of the top encapsulation 902 and the recess 928 of the base encapsulation 926 can aid stacking alignment between the top integrated circuit package system 932 and the stackable integrated circuit package system 904. The protruding portion 950 of the top integrated circuit package system 932 fits and matches into the recess 928 of the stackable integrated circuit package system 904. The top integrated circuit package system 932 can overhang over the stackable integrated circuit package system 904.

Fourth electrical connectors 964, such as bond wires, connects a overhanging portion of the top carrier 934 and the second base side 914 the base carrier 910 of the stackable integrated circuit package system 904. A package encapsulation 966, such as a cover including an epoxy molding compound, covers the fourth electrical connectors 964, non-horizontal peripheral sides of the stackable integrated circuit package system 904, and a peripheral portion of the second base side 914 of the base carrier 910.

Figure 10:
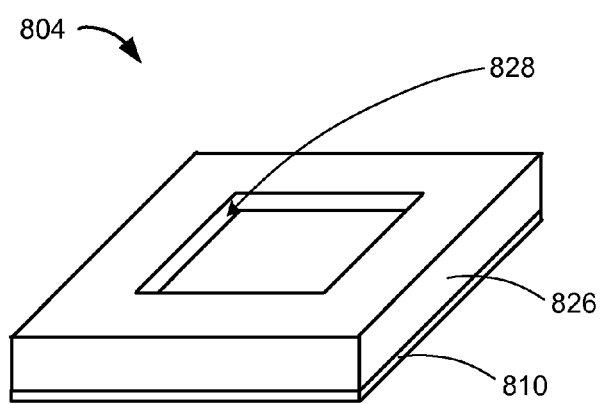
FIG. 10 is a is an isometric view of the stackable integrated circuit package system of FIG. 8.

Referring now to FIG. 10, therein is shown an isometric view of the stackable integrated circuit package system 804 of FIG. 8. The isometric view depicts the base encapsulation 826 over the base carrier 810. The recess 828 is shown within the base encapsulation 826 and not extending to the non-horizontal sides of the base encapsulation 826.

For illustrative purposes, the stackable integrated circuit package system 804 is shown with the recess 828 within the non-horizontal sides of the base encapsulation 826, although it is understood that the stackable integrated circuit package system 804 may have a different configuration. For example, the recess 828 can extend to one or more of the non-horizontal sides of the base encapsulation 826.

Figure 11:
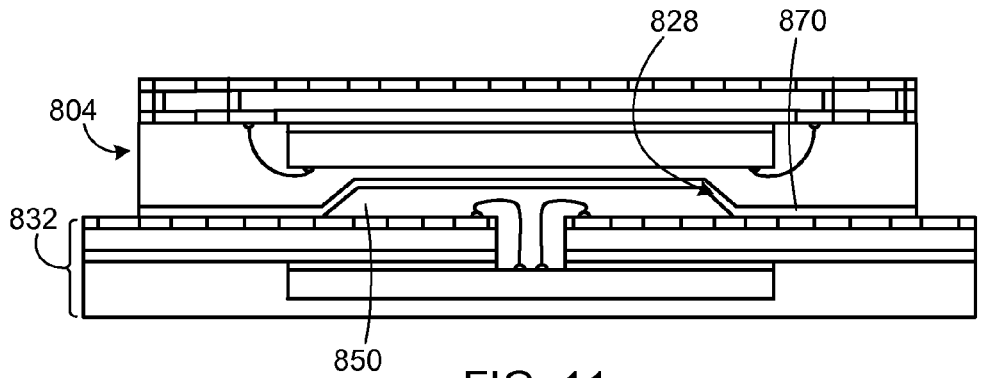
FIG. 11 is a cross-sectional view of the integrated circuit package system of FIG. 8 in an attaching phase of the stackable integrated circuit package system.

Referring now to FIG. 11, therein is shown a cross-sectional view of the integrated circuit package system 800 of FIG. 8 in an attaching phase of the stackable integrated circuit package system 804. The top integrated circuit package system 832 is shown in a vertically flipped orientation to the orientation shown in FIG. 8. The stackable integrated circuit package system 804 is mounted over the top integrated circuit package system 832 with the stacking adhesive 870. The protruding portion 850 and the recess 828 can aide in the alignment of the top integrated circuit package system 832 and the stackable integrated circuit package system 804.

Figure 12:
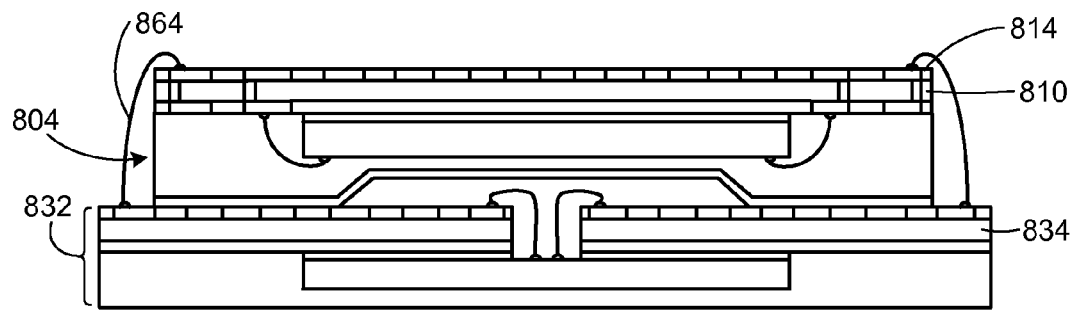
FIG. 12 is the structure of FIG. 11 in a connecting phase of the fourth electrical interconnects.

Referring now to FIG. 12, therein is shown the structure of FIG. 11 in a connecting phase of the fourth electrical connectors 864. The fourth electrical connectors 864 connect the second base side 814 of the base carrier 810 and the exposed portion of the top carrier 834. The fourth electrical connectors 864 connect the stackable integrated circuit package system 804 and the top integrated circuit package system 832.

Figure 13:
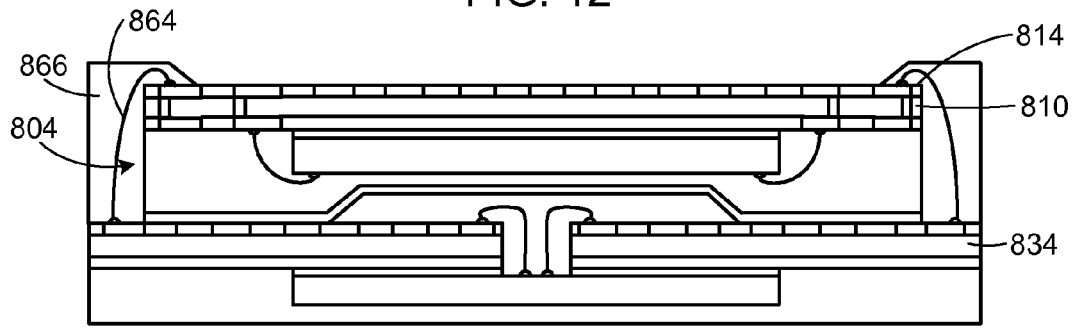
FIG. 13 is the structure in FIG. 12 in a molding phase of the package encapsulation.

Referring now to FIG. 13, therein is shown the structure in FIG. 12 in a molding phase of the package encapsulation 866.

The package encapsulation 866 can be formed over the top carrier 834 exposed by the stackable integrated circuit package system 804 and surrounding the stackable integrated circuit package system 804. The package encapsulation 866 also covers the fourth electrical connectors 864 and the peripheral portion of the second base side 814 of the base carrier 810.

Figure 14:
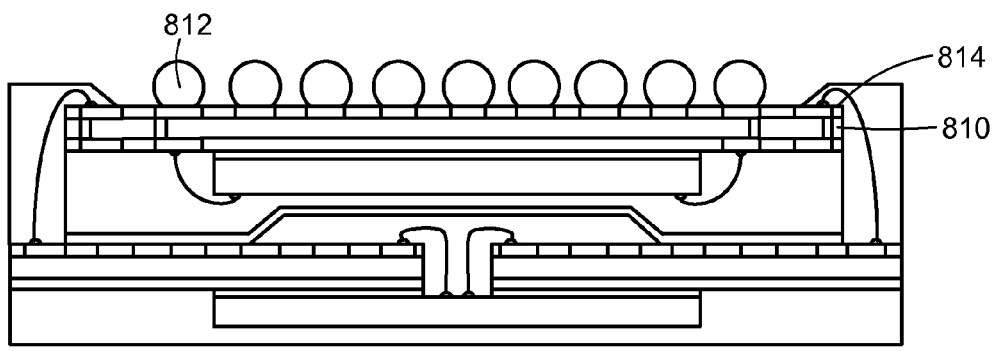
FIG. 14 is the structure in FIG. 13 in a forming phase of the bottom interconnects.

Referring now to FIG. 14, therein is shown the structure in FIG. 13 in a forming phase of the bottom interconnects 812. The bottom interconnects 812 are formed over an exposed portion the second base side 814 of the base carrier 810 forming the integrated circuit package system 800.

Figure 15:
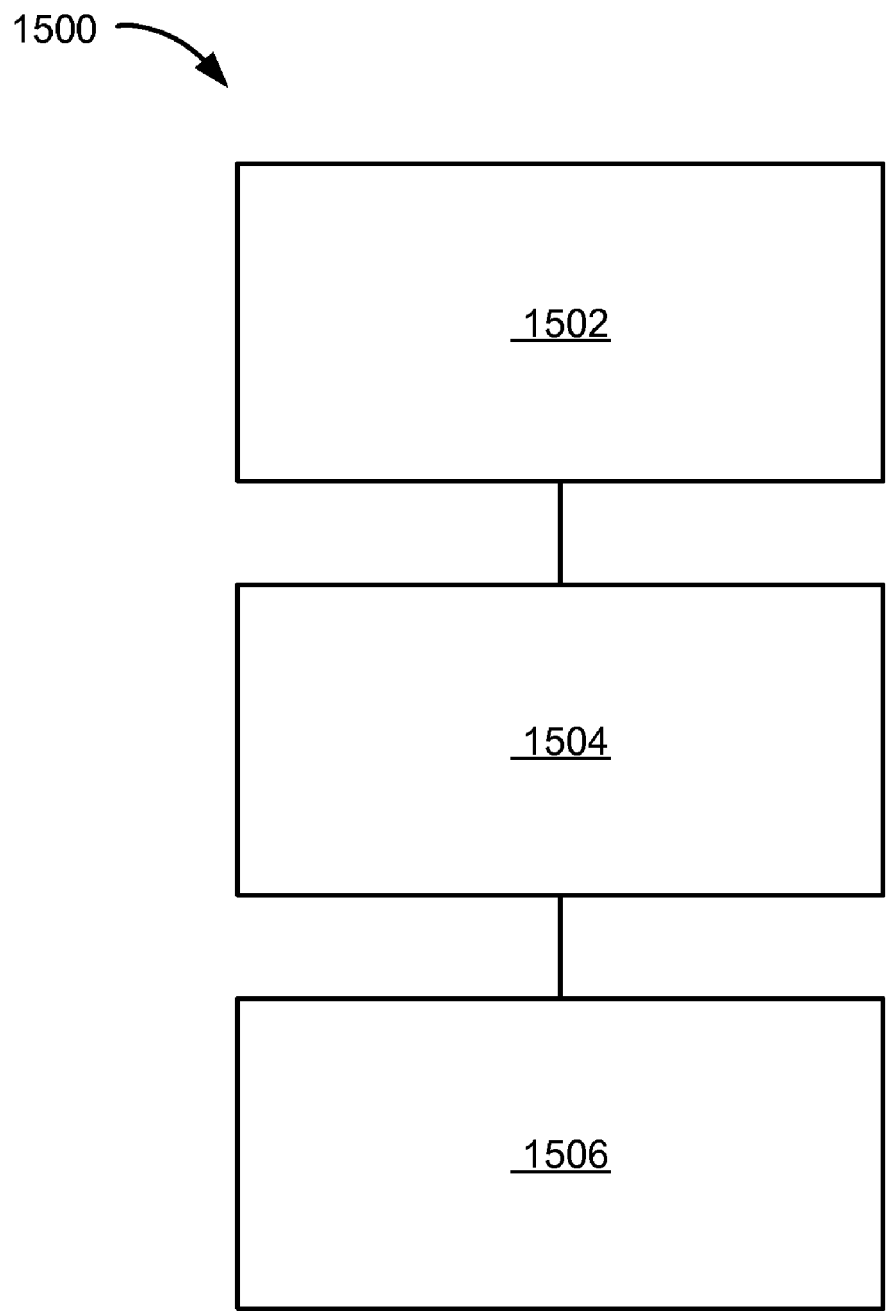
FIG. 15 is a flow chart of an integrated circuit package system for manufacture of the integrated circuit package system in an embodiment of the present invention.

Referring now to FIG. 15, therein is shown a flow chart of an integrated circuit package system 1500 for manufacture of the integrated circuit package system 100 in an embodiment of the present invention. The system 1500 includes providing a stackable integrated circuit package system having a base encapsulation and a recess therein in a block 1502; stacking a top integrated circuit package system, having a top encapsulation with a protruding portion, with the stackable integrated circuit package system with the protruding portion aligned and matched within the recess in a block 1504; and connecting the top integrated circuit package system and the stackable integrated circuit package system in a block 1506.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the mountable integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   providing a stackable integrated circuit package system having a first integrated circuit and a base encapsulation with a recess therein over the first integrated circuit;
   providing a top integrated circuit package system, having a top encapsulation with a protruding portion filling a hole of a top carrier;
   stacking the top integrated circuit package system with the stackable integrated circuit package system and the protruding portion aligned and matched within the recess; and
   connecting a stacking connector between the stackable integrated circuit package system and the top integrated circuit package system with the protruding portion extending below the stacking connector.

2. The method as claimed in claim 1 wherein stacking the top integrated circuit package system with the stackable integrated circuit package system includes applying a stacking adhesive between the base encapsulation and the top encapsulation.

3. The method as claimed in claim 1 wherein stacking the top integrated circuit package system includes stacking a top carrier with a second integrated circuit thereover.

4. The method as claimed in claim 1 wherein stacking the top integrated circuit package system includes stacking a top carrier with an integrated circuit thereunder and within the protruding portion.

5. The method as claimed in claim 1 wherein connecting the stacking connector includes:
   connecting an electrical connector between an exposed portion of a top carrier of the top integrated circuit package system and a base carrier of the stackable integrated circuit package system; and
further comprising:
   forming a package encapsulation covering the electrical connector along a nonhorizontal peripheral side of the stackable integrated circuit package system.

6. A method of manufacturing an integrated circuit package system comprising:
   providing a stackable integrated circuit package system having a first integrated circuit and a base encapsulation with recess therein over the first integrated circuit;
   providing a top integrated circuit package system, having a second integrated circuit covered by a top encapsulation with a protruding portion filling a hole of a top carrier;
   stacking the top integrated circuit package system with the stackable integrated circuit package system and the protruding portion aligned and matched within the recess; and
   connecting a stacking connector between the stackable integrated circuit package system and the top integrated circuit package system with the protruding portion extending below the stacking connector.

7. The system as claimed in claim 6 wherein:
   providing the stackable integrated circuit package system having the first integrated circuit includes exposing the first integrated circuit with the recess; and
   stacking the top integrated circuit package system and the stackable integrated circuit package system includes attaching an adhesive between the first integrated circuit and the protruding portion of the top encapsulation.

8. The system as claimed in claim 6 wherein:
   providing the stackable integrated circuit package system having the first integrated circuit includes providing a stackable interconnect adjacent to the first integrated circuit.

9. The method as claimed in claim 6 wherein stacking the top integrated circuit package system and the stackable integrated circuit package system includes extending the top integrated circuit package system horizontally beyond the stackable integrated circuit package system.

10. The method as claimed in claim 6 wherein connecting the stacking connector includes:
   connecting an electrical connector between an exposed portion of a top carrier of the top integrated circuit package system and a base carrier of the stackable integrated circuit package system; and
further comprising:
   forming a package encapsulation covering the electrical connector along a nonhorizontal peripheral side of the stackable integrated circuit package system and between the top integrated circuit package system and the stackable integrated circuit package system.

11. An integrated circuit package system comprising:
a stackable integrated circuit package system having a first integrated circuit and a base encapsulation with a recess therein over the first integrated circuit
a top integrated circuit package system, having a top encapsulation with a protruding portion filling a hole of a top carrier, stacked and connected with the stackable integrated circuit package system and the protruding portion aligned and matched within the recess; and
a stacking connector between the stackable integrated circuit package and the top integrated circuit package with the protruding portion extending below the stacking connector.

12. The system as claimed in claim 11 wherein the top integrated circuit package system stacked with the stackable integrated circuit package system includes a stacking adhesive between the base encapsulation and the top encapsulation.

13. The system as claimed in claim 11 wherein the top integrated circuit package system includes a top carrier with a second integrated circuit thereover.

14. The system as claimed in claim 11 wherein the top integrated circuit package system includes a top carrier with an integrated circuit thereunder and within the protruding portion.

15. The system as claimed in claim 11 wherein the top integrated circuit package system connected with the stackable integrated circuit package system includes:
an electrical connector between an exposed portion of a top carrier of the top integrated circuit package system and the base carrier of the stackable integrated circuit package system; and
further comprising:
a package encapsulation covering the electrical connector along a nonhorizontal peripheral side of the stackable integrated circuit package system.

16. The system as claimed in claim 11 wherein:
the stackable integrated circuit package system includes a first integrated circuit and the base encapsulation with the recess therein over the first integrated circuit; and
the top integrated circuit package system includes a second integrated circuit covered by the top encapsulation with the protruding portion.

17. The system as claimed in claim 16 wherein:
providing the stackable integrated circuit package system having the first integrated circuit includes exposing the first integrated circuit with the recess; and
stacking the top integrated circuit package system and the stackable integrated circuit package system includes attaching an adhesive between the first integrated circuit and the protruding portion of the top encapsulation.

18. The system as claimed in claim 16 wherein:
the stackable integrated circuit package system includes providing a stackable interconnect adjacent to the first integrated circuit; and
the top integrated circuit package system includes the stacking connector with the stacking connector aligned with the stackable interconnect.

19. The system as claimed in claim 16 wherein the top integrated circuit package system stacked with the stackable integrated circuit package system includes extending the top integrated circuit package system horizontally beyond the stackable integrated circuit package system.

20. The system as claimed in claim 16 further comprising:
an electrical connector between an exposed portion of a top carrier of the top integrated circuit package system and a base carrier of the stackable integrated circuit package system; and
a package encapsulation covering the electrical connector along a nonhorizontal peripheral side of the stackable integrated circuit package system and between the top integrated circuit package system and the stackable integrated circuit package system.

* * * * *

UNITED STATES PATENT AND TRADEMARK OFFICE
CERTIFICATE OF CORRECTION

| | | |
|---|---|---|
| PATENT NO. | : 8,247,894 B2 | Page 1 of 1 |
| APPLICATION NO. | : 12/053751 | |
| DATED | : August 21, 2012 | |
| INVENTOR(S) | : Yoon et al. | |

It is certified that error appears in the above-identified patent and that said Letters Patent is hereby corrected as shown below:

In the Specification:

Column 4, lines 41 and 42, delete "intergrated" and insert therefor --integrated--

In the Claims:

Column 14, Claim 7, line 40, delete "system" and insert therefor --method--

Column 14, Claim 8, line 48, delete "system" and insert therefor --method--

Signed and Sealed this
First Day of April, 2014

Michelle K. Lee
*Deputy Director of the United States Patent and Trademark Office*